(12) United States Patent
Stoll et al.

(10) Patent No.: US 10,388,836 B2
(45) Date of Patent: Aug. 20, 2019

(54) LIGHT-EMITTING DEVICE AND METHOD FOR PRODUCING A LIGHT-EMITTING DEVICE

(71) Applicant: OSRAM Opto Semiconductors GmbH, Regensburg (DE)

(72) Inventors: Ion Stoll, Tegernheim (DE); Norwin von Malm, Nittendorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 442 days.

(21) Appl. No.: 15/302,029

(22) PCT Filed: Mar. 18, 2015

(86) PCT No.: PCT/EP2015/055702
§ 371 (c)(1),
(2) Date: Oct. 5, 2016

(87) PCT Pub. No.: WO2015/154958
PCT Pub. Date: Oct. 15, 2015

(65) Prior Publication Data
US 2017/0117444 A1    Apr. 27, 2017

(30) Foreign Application Priority Data
Apr. 10, 2014   (DE) .......................... 10 2014 105 142

(51) Int. Cl.
*H01L 33/50* (2010.01)
*C09K 11/02* (2006.01)
(Continued)

(52) U.S. Cl.
CPC ............ *H01L 33/504* (2013.01); *C09K 11/02* (2013.01); *C09K 11/06* (2013.01); *H01L 33/501* (2013.01);
(Continued)

(58) Field of Classification Search
CPC ....... C09K 11/02; C09K 11/06; H01L 33/501; H01L 33/502; H01L 33/504
See application file for complete search history.

(56) References Cited

U.S. PATENT DOCUMENTS

2009/0173957 A1 * 7/2009 Brunner ............. C09K 11/7701
257/98
2011/0068322 A1    3/2011 Pickett et al.
(Continued)

FOREIGN PATENT DOCUMENTS

CN          1896738 A     1/2007
CN        101440279 A     5/2009
(Continued)

OTHER PUBLICATIONS

Wei et al., RSC Adv., 2014, 4, 50086.*
(Continued)

*Primary Examiner* — Vu A Nguyen
(74) *Attorney, Agent, or Firm* — Slater Matsil, LLP (57) ABSTRACT

A light-emitting device includes a light-emitting semiconductor component that emits first light in a first wavelength range during operation A wavelength conversion element converts the first light at least partly into second light in a second wavelength range is arranged in the beam path of the first light. The second wavelength range differs from the first wavelength range. The wavelength conversion element includes nanoparticles containing organic luminescent molecules in a basic material formed from an $SiO_2$-based material. A method for producing a light-emitting device is furthermore specified.

20 Claims, 2 Drawing Sheets

(51) Int. Cl.
*H01L 51/52* (2006.01)
*C09K 11/06* (2006.01)
*H01L 27/32* (2006.01)
*H01L 51/56* (2006.01)

(52) U.S. Cl.
CPC ........ *H01L 33/502* (2013.01); *H01L 51/5268* (2013.01); *H01L 51/5281* (2013.01); *H01L 27/322* (2013.01); *H01L 51/56* (2013.01); *H01L 2251/303* (2013.01); *H01L 2251/5369* (2013.01); *H01L 2933/0033* (2013.01); *H01L 2933/0041* (2013.01); *H01L 2933/0091* (2013.01)

(56) References Cited

U.S. PATENT DOCUMENTS

| | | |
|---|---|---|
| 2011/0284494 A1 | 11/2011 | Von Malm |
| 2012/0091923 A1 | 4/2012 | Kastner-Jung et al. |
| 2012/0207923 A1 | 8/2012 | Baumgartner |
| 2014/0049155 A1 | 2/2014 | Kurtin |
| 2015/0228870 A1 | 8/2015 | Goeoetz et al. |
| 2015/0252963 A1 | 9/2015 | Stoll et al. |

FOREIGN PATENT DOCUMENTS

| | | |
|---|---|---|
| CN | 101937911 A | 1/2011 |
| DE | 102005061828 A1 | 1/2007 |
| DE | 102007054800 A1 | 4/2009 |
| DE | 102009049056 A1 | 4/2011 |
| DE | 102012109020 A1 | 3/2014 |
| DE | 102012109217 A1 | 4/2014 |
| JP | 2006300930 A | 11/2006 |
| WO | 2005067485 A2 | 7/2005 |
| WO | 2006125313 A1 | 11/2006 |
| WO | 2009036720 A1 | 3/2009 |
| WO | 2010066245 A1 | 6/2010 |
| WO | 2014029642 A1 | 2/2014 |
| WO | 2014048682 A1 | 4/2014 |

OTHER PUBLICATIONS

Jung et al., J. Mater. Chem. C, 2013, 1, 5879.*
Bonacchi, S. et al., "Luminescent Silica Nanoparticles: Extending the Frontiers of Brightness," Angewandte Chemie International Edition, Mar. 25, 2011, pp. 4056-4066, vol. 50.
Jung, H.S. et al., "White Light Emitting Diodes Using Thermally and Photochemically Stable Fluorescent Silica Nanoparticles as Color-Converters," Journal of Materials Chemistry C, Jul. 2013, pp. 5879-5884, vol. 1, Issue 37.
Ow, H. et al., "Bright and Stable Core-Shell Fluorescent Silica Nanoparticles," Nano Letters, American Chemical Society, Jan. 2005, pp. 113-117, vol. 5, No. 1.
Schnitzer, I. et al., "30% External Quantum Efficiency From Surface Textured, Thin-Film Light-Emitting Diodes," Applied Physics Letters, Oct. 18, 1993, pp. 2174-2176, vol. 63, No. 16.

* cited by examiner

FIG. 6

LIGHT-EMITTING DEVICE AND METHOD FOR PRODUCING A LIGHT-EMITTING DEVICE

This patent application is a national phase filing under section 371 of PCT/EP2015/055702, filed Mar. 18, 2015, which claims the priority of German patent application 10 2014 105 142.4, filed Apr. 10, 2014, each of which is incorporated herein by reference in its entirety.

TECHNICAL FIELD

A light-emitting device and a method for producing a light-emitting device are provided.

SUMMARY OF THE INVENTION

Certain embodiments of the invention provide a light-emitting device having a wavelength conversion element. Certain other embodiments provide a method for producing such a light-emitting device.

According to at least one embodiment, a light-emitting device comprises a light-emitting semiconductor component which emits first light in a first wavelength range during operation. The first wavelength range may in particular be in an infrared, visible and/or ultraviolet spectral range. Particularly preferably, the first wavelength range may be in a visible spectral range, i.e., in a blue, green and/or red spectral range. In the case of an infrared-light-emitting device, the first wavelength range may also be in the near infrared spectral range.

According to at least one embodiment, the light-emitting semiconductor component is designed as an inorganic light-emitting semiconductor component or may comprise such a component. For example, the light-emitting semiconductor component may comprise an inorganic light-emitting diode or be formed by such a diode. The inorganic light-emitting diode may, for example, comprise a light-emitting semiconductor chip, which comprises at least one active layer for generating the first light.

According to a further embodiment, the light-emitting semiconductor component is designed as an organic light-emitting semiconductor component or at least comprises such a component. In particular, the light emitting semiconductor component may comprise, in this case, an organic light-emitting diode or be formed by such a diode.

According to a further embodiment, the light-emitting device comprises a wavelength conversion element. The wavelength conversion element is, in particular, arranged in the beam path of the first light. This means, that the first light generated in operation by the light-emitting semiconductor component at least partially illuminates the wavelength conversion element and is thus radiated on and/or into the wavelength conversion element. The wavelength conversion element is in particular designed such that the first light impinging the wavelength conversion element is at least partially converted into second light in a second wavelength range which is different from the first wavelength range. For example, the second wavelength range can be shifted in the direction of a longer-wave spectral range, compared to the first wavelength range. Additionally or alternatively, it may as well be true that the second wavelength range is shifted, due to a so-called upward conversion, in the direction of a shorter spectral range compared to the first wavelength range. The second wavelength range may, in particular, comprise multiple continuous or even non-continuous spectral ranges, which are at least partially different from the first wavelength range of the first light. The light-emitting device radiates light, in particular during operation, which contains the second light generated by the wavelength conversion element through conversion of the first light. Furthermore, the light radiated by the light-emitting device may as well comprise non-converted first light.

According to a further embodiment, the wavelength conversion element comprises nanoparticles, here and in the following also referred to as nano-scaled particles, which contain organic luminescent molecules. The organic luminescent molecules are, in particular, contained in a basic material, by means of which material the nanoparticles are basically formed. In particular, the nanoparticles can essentially be based upon a glass-type or glass-like material or comprise such a material that the organic luminescent molecules are contained in. The basic material substantially forming the nanoparticles may particularly preferably be based upon silica ($SiO_2$) or be $SiO_2$. In particular, the nanoparticles may thus comprise a $SiO_2$-based material as basic material, in which the organic luminescent molecules are contained. The organic luminescent molecules are thus embedded in the basic material, so that the nanoparticles include organic luminescent molecules in the interior thereof. In particular, the wavelength-conversion element thus preferably comprises $SiO_2$-based nanoparticles, with organic dye molecules being integrated therein in the form of the organic luminescent molecules. By means of the wavelength conversion element with the nanoparticles, the organic luminescent molecules are introduced in the light path of the first light of the light-emitting semiconductor component for wavelength conversion.

As used here and in the following, the fact that the nanoparticles are "substantially" based upon a certain material, i.e., the basic material, means that the material, apart from the organic luminescent molecules, forms the main component of the nanoparticles, for example in an amount of more than 80 wt.-% or more than 90 wt.-% or more than 99 wt.-%, wherein the organic luminescent molecules are not considered.

Nanoparticles which contain organic luminescent molecules in an $SiO_2$-based material are also known as so-called dye-doped silica nanoparticles (DDSN) as described in document S. Bonacchi et al., Luminescent Silica Nanoparticles: Extending the Frontiers of Brightness, Angew. Chem. Int. Ed. 2011, 50, 4056-4066, the disclosure of which, for example particularly with respect to properties and different production methods, is incorporated herein in its entirety by reference.

According to a further embodiment, the nanoparticles have a size of less than or equal to 1,000 nm. Furthermore, the nanoparticles may have a size of less than or equal to 800 nm, or less than or equal to 500 nm, or less than or equal to 200 nm or less than or equal to 100 nm. Furthermore, the nanoparticles may have a size of greater than or equal to 1 nm, or greater than or equal to 5 nm, or greater than or equal to 10 nm, or greater than or equal to 15 nm, or greater than or equal to 20 nm or greater than or equal to 30 nm. Particularly preferably, the nanoparticles may for example have a size of greater than or equal to 1 nm and less than or equal to 1,000 nm, or of greater than or equal to 1 nm and less than or equal to 100 nm or of greater than or equal to 10 nm and less than or equal to 50 nm.

In a particularly preferred embodiment, the light-emitting device comprises a light-emitting semiconductor component which emits first light in a first wavelength range during operation, and a wavelength conversion element in the beam path of the first light, which at least partially converts the first light into second light and which contains nano-scaled $SiO_2$-particles having organic luminescent molecules inside of them.

In particular, the light-emitting device may be provided for emitting white light or mixed light of a different color, which is formed by a superimposition of non-converted first light and the second light generated by the wavelength conversion element. It may furthermore be possible for the light-emitting device to only radiate second light, so that the light directly generated by the light-emitting semiconductor component is converted, completely or almost completely, in particular for more than 90% or more than 95% or more than 99% by the wavelength conversion element. In this case, the light-emitting device may also radiate mixed light depending on the design of the wavelength conversion element, namely light with spectral components in multiple wavelength ranges, or even monochromatic light.

In order to generate white light or light of a different color with a semiconductor component, usually narrow-banded light emitted by the semiconductor component is converted into light of another wavelength range by means of a wavelength converter. The wavelength converter is introduced into the light path of the light emitted by the semiconductor component for the light conversion. If organic luminescent molecules are used as material for wavelength conversion, it is to be considered that the materials typically may have a lower radiation and a lower temperature stability toward reactants, for example from the air or a matrix material, compared to inorganic conversion materials. Wavelength converters are typically introduced in a matrix material into the light path of a semiconductor component. It is also known from the prior art to molecularly dissolve organic materials in the matrix material in order to achieve high quantum efficiency. Simultaneously, the chemical environment of the organic luminescent molecule must not lead to a radiation-free decrease of the excitation energy. This considerably restricts the matrix materials chosen in prior art. It is known, for example, to use a matrix material having a lower permeability against oxygen and water. This prevents that the reactants are present for chemical decomposition of the organic luminescent molecules. Just as well, the matrix material or the entire component can be encapsulated by a non-permeable material such as parylene, for example. However, it is currently not known in the use of common materials, in which organic luminescent molecules are dissolved, how to sufficiently protect the organic materials in a common housing, such as a LED housing, for example, against irreversible degradation.

In contrast, in the light-emitting device described herein, the organic luminescent molecules, which can in particular be highly reactive with other reactants such as oxygen, water, functional groups of a surrounding matrix material, hydrogen sulfide and other substances, in the excited state, are protected by an encapsulation in the material, by which material the nanoparticles are basically formed, i.e. in particular an $SiO_2$-based material, against decomposition reactions. In particular, with the described glass-like or glass-type material as basic material, a chemically very inert material is used for the nanoparticles. Due to the fact that organic dyes can be produced very cost-effective in large amounts, use of the nanoparticles described herein thus represents a very cost-efficient conversion option, as the nanoparticles can be produced in very large amounts as well. Furthermore, organic dyes are known in almost any emission wavelength and with emission spectra, which, beginning from very broad, such as in $Alq_3$, can be designed to very narrow, such as in $Eu^{3+}$-complexes, for example. In the light-emitting device describes herein, this enables utilization of organic luminescent molecules as wavelength conversion material in conjunction with a light-emitting semiconductor component, wherein the materials have an improved stability by using the nanoparticles and therefore can be processed by mechanically intermixing in a broad selection of matrix materials.

By the so-called stokes shift, usually heat develops in a dye upon light conversion. In the light-emitting device described herein, the heat can directly be dissipated from the organic luminescent molecules to the surrounding, preferably well heat-conductive nanoparticles material. A nanoparticle may then distribute the heat to a greater volume which can be formed by a matrix surrounding the nanoparticles and which possibly may be poorly heat-conductive, such as silicone or another material, for example. Since the organic luminescent molecules are embedded into the nanoparticles, a chemical or physical tolerance of the organic dye with a matrix material surrounding the nanoparticles is not required so that an arbitrary combination of organic luminescent molecules and a matrix material can be used in the wavelength conversion element described herein.

Furthermore, as described below, many different processes are possible, by means of which the nanoparticles can be introduced in the light path of the light-emitting semiconductor component. Energy transfer processes to a matrix material surrounding the nanoparticles, which might lead to a loss in efficiency upon the direct embedding of the organic luminescent molecules into a matrix material, are prevented by the photophysically inert nanoparticle material. In the use of $SiO_2$-based material, the material is characterized by an extremely high bandwidth and by the presence of only one or no OH groups at all. Furthermore, it is also possible to produce the nanoparticles with a narrow and controlled size distribution, thereby facilitating processability of matrix materials containing the nanoparticles. Furthermore, $SiO_2$ has an almost identical refractive index when compared to most of the common matrix materials, so that a light scattering in the wavelength conversion element on the nanoparticles can be prevented. Scattering properties of the wavelength conversion element can thus be adjusted in a targeted manner, as described below, by adding scattering particles, so that the radiation profile and the color or the conversion degree of the wavelength conversion element can be adjusted and optimized separately. By including the organic luminescent molecules into the nanoparticles, the molecules do not present any health hazards, irrespective of the contained dye.

Here and in the following, organic luminescent molecules are to be understood as pure organic molecules as well as organic molecules having metal atoms, i.e. metalorganic molecules with one or more metal centers.

According to a further embodiment, the organic luminescent molecules comprise one or more of the following materials: acridine dyes, acridinone dyes, anthraquino dyes, anthracene dyes, cyanine dyes, dansyl dyes, squaryllium dyes, spiropyrans, boron-dipyrromethenes, perylenes, pyrenes, naphthalenes, flavins, pyrroles, porphyrins and the metal complexes thereof, diarylmethane dyes, triarylmethane dyes, nitro and nitroso dyes, phthalocyanine dyes and metal complexes of phthalocyanines, quinones, azo dyes, indophenol dyes, oxazines, oxazones, thiazines and thiazoles, fluorenes, flurones, pyronines, rhodamines, coumarins.

According to a further embodiment, the organic luminescent molecules comprise transition metal complexes with organic ligands. A plurality of such materials emit from a triplet state. Due to the involved prohibited transition, the materials usually have a long luminescent life. Preferably, one or more of the following materials selected from Rh, Os, Ru, Ir, Pd and Pt are used as transition metals. Particularly preferably, Ir(III), Os(II), Pt(II), Ru(II) can be used, for example. Moreover, other transition metals are possible, too. Furthermore, the organic ligands are selected from one or more of the following materials, derived from the following basic matrices: porphyrins, porphines, 2,2-bipyridines, 2-phenylpyridines, 3-(thiazole-2-yl), 3-(benzothiazole-2-yl), 3-(imidazole-2-yl), 3-(benzimidazole-2-yl), pyridyl azolate. In this case, the organic ligands may produce the charge neutrality of the wavelength conversion material or the metal centers can additionally carry counter ions. In the individual metal complexes, also mixtures of different ligands, particularly preferably of the above-mentioned classes of ligands, may be present.

As pure organic molecules for the organic luminescent molecules, preferably parylene imides and parylene carboxylates are suitable. In the case of transition metal complexes for the organic luminescent molecules, are particularly preferred:
tris(4,7-diphenyl-1,10-phenanthroline) ruthenium (II) chloride;
iridium(III)bis(2-phenylquinolyl)-2-N,C2'acetylacetonat;
bis(2-(2'-benzothienyl)-pyridinato-N,C3')iridium(acetylacetonate);
tris(2,5-bis-2'-(9',9'-dihexylfluoren) pyridine) iridium(III);
$(btp)_2Ir(acac)$;
$(piq)_3Ir$;
$(piq)_3Ir(acac)$;
tris-(8-hydroxyquinoline) aluminum $(Alq_3)$;
Pt(II) tetraphenyltetrabenzoporphyrine;
Pd(II) tetraphenyltetrabenzoporphyrine;
$[Os(btfp)_2(dppb)]$;
$[Os(btfp)_2(pp2b)]$;
$[Os(tfp)_2(dppb)]$;
$[Os(ibifp)_2(dppb)]$.

Herein mean
piq: 1-phenylisoquinolato;
btp: 2-(2'-benzo[4,5-α]thienyl)pyridinato);
acac: acetylacetonat;
btfp: 5-(benzothiazol-2-yl)-3-trifluoromethylpyrazol;
dppb: 1,2-bis-(diphenylphosphino)benzene;
pp2b: 2-bis (phospholano)benzene;
tfp: 5-thiazol-2-yl)-3-trifluoromehtylpyrazole;
ibifp: 5-(1-isopropylbenzimidazole-2-yl)-3-trifluoromethylpyrazol.

According to a further embodiment, the nanoparticles comprise anchor molecules by means of which the nanoparticles bind to preselected chemical surfaces in a chemical and selective manner. If suitable anchoring chains and surfaces, for example of the light-emitting semiconductor component, are used, monolayers of nanoparticles (self-assembling monolayers (SAM)) can be produced in a self-limiting process. Therefore, the resulting color location of the light-emitting device can precisely be determined in advance, with the known problem of "color binnings" being omitted.

For example, the pre-selected surfaces of the light-emitting semiconductor component can be formed by one or more of the following materials: GaN, GaAlAs, InGaAlP, $SiO_2$, $Al_2O_3$, $Si_3N_4$, polysiloxanes. the anchoring molecule chains can for example be formed by one or more of the following molecules: R—OMe, R—OEt, R-Tos, R—Si (OMe)$_3$, R—Si(OEt)$_3$, R—SH, wherein R designates an organic molecule chain having a chemical connection to the nanoparticles and OMe designates a methoxy group, OEt an ethoxy group and Tos a tosyl group (p-toluenesulfonyl group).

According to a further embodiment, the wavelength conversion element comprises a matrix material in which the nanoparticles are arranged. One or more of the following materials can be used as matrix material: polyacrylate, polyolefines, polyethylene (PE), for example with higher or lower density, polypropylene (PP), polyvinyl chloride (PVC), polystyrene (PS), polyester, polycarbonate (PC), polyethylene terephthalate (PET), polyethersulfone (PES), polyethylene naphthalate (PEN), polymethylmethacrylate (PMMA), polyimide (PI), polyether ketones as for example polyether ether ketone (PEEK), polyamide, for example polyphtalamide (PPA), polycyclohexylenedimethylene-terephthalate (PCT), silicone, epoxy and liquid crystalline polymer, (LCP).

According to a further embodiment, the nanoparticles comprise a coating. The coating may in particular be arranged around the basic material of the nanoparticle, i.e. the $SiO_2$-based material, for example, and in each case cover the nanoparticles. The coating may comprise an inorganic material, such as $Al_2O_3$, for example. Furthermore, the coating may as well comprise an organic material. The coating may for example prevent a particle aggregation, increase the pourability of the particles, change a refractive index, and/or serve as a wavelength filter, in order to filter short-wave first light, i.e. exciting light, in order to prevent a chemical decomposition of the organic luminescent molecules and/or to absorb certain emission areas of the wavelength conversion substance and thus make the spectrum more narrow-banded.

Furthermore, other materials, in addition to the nanoparticles, can be contained in the wavelength conversion element. For example, the wavelength conversion element can further comprise scattering particles which in particular can be distributed within the matrix material just as the nanoparticles. Here and in the following, such particulate-shaped materials are referred to as scattering particles, which only lead to a light scattering or light refraction, for example, but not to a conversion of light, such as it is the case with the nanoparticles. For example, the scattering particles may comprise or consist of $TiO_2$, $Al_2O_3$ or glass particles.

By adding additional scattering particles into the matrix material, the light scattering and therefore the radiation characteristic in the wavelength conversion element can be changed.

Furthermore, the matrix material may comprise fillers preventing aggregation of the contained particles, change the refractive index and/or can serve as wavelength filters.

According to a further embodiment, the wavelength conversion element comprises further wavelength conversion substances in addition to the wavelength conversion substances. Thus, the nanoparticles as conversion material can be used together with other materials for light conversion in the light-emitting device described herein. The further wavelength conversion elements may comprise or consist of inorganic phosphors. The inorganic phosphors may comprise one or more selected form the following materials: Ce3+ doped garnet, such as YAG:Ce and LuAG:Ce, for example $(Y, Lu, Gd, Tb)_3(Al_{1-x}Ga_x)_5O_{12}:Ce^{3+}$; $Eu^{2+}$-doped nitrides, for example $(Ca, Sr)AlSiN_3:Eu^{2+}$, $(Ca, Ba, Sr)_2Si_5N_8:Eu^{2+}$, $Eu^{2+}$-doped sulfides; $(Ba, Sr, Ca)Si_2Al_2N_6$; $(Ba, Sr, Ca) SiO_2N_2$; SiAlON; $(Ba, Sr, Ca)_2SiO_4:Eu^{2+}$, $(Sr, Ca)AlSiN_3*Si_2N_2O$; $Ca_8Mg(SiO_4)_4Cl_2$, chloro-phosphate, $BaMgAl_{10}O_7$:Eu (barium magnesium aluminate:Eu, BAM) $(Ba, Sr, Ca)_5(PO_4)_3Cl$:Eu (SCAP), halo-phosphates. Here, the light-emitting semiconductor component may excite the nanoparticles as well as the inorganic phosphor or only one of them, for example, wherein the respective other wavelength converter can then be excited by the first wavelength converter. Furthermore, the nanoparticles can be used in conjunction with semiconductor nanoparticles for light conversion.

In the base material, in the $SiO_2$-based material, for example, the nanoparticles can additionally comprise one or more of the following materials: alkaline metals, alkaline earth-metals, halogens, Al, Zr, Hf, Ge, Sn, Pb, B, In, Ga, N, C, P, Ti, Sc, Y, As, Sb, S, Se, H, deuterium. The additional elements preferably have a content of less than 5% and particularly preferred of less than 1%, concerning the weight of the nanoparticles. Furthermore, semiconductor nanoparticles can be introduced in the nanoparticle basic material, i.e. in the $SiO_2$-based material, for example.

According to further embodiments, the nanoparticles may have one or more of the following features:

The nanoparticles can be excited by a semiconductor emission, in the blue, green or red spectral range, preferably by an emission with a width ("full width at half maximum", FWHM) of less than 120 nm in the range of 400 to 800 nm.

The nanoparticles can be excited by a broad-banded emission with a width (FWHM) of greater than or equal to 120 nm in the visible range.

The nanoparticles can be excited by an infrared emission and convert light in an even longer-wave infrared range.

The e nanoparticles may contain photon-up-converting dyes.

The nanoparticles can be excited by means of UV light.

The nanoparticles may include thermocromatic dyes.

According to a further embodiment, the wavelength conversion element is indirectly applied onto the light-emitting semiconductor component. This may mean, in particular, that the wavelength conversion element is directly applied to a surface of the light-emitting semiconductor component. As an alternative, it is just as well possible for the wavelength conversion element, and thus the nanoparticles, to be arranged at a distance to the light-emitting semiconductor component. In such a configuration, also referred to as remote arrangement, further materials in the form of layers or in the form of a potting of the light-emitting semiconductor component can be arranged between the wavelength conversion element and the light-emitting semiconductor component. Furthermore, it is as well possible for a gas, such as air, for example, to be arranged between the semiconductor component and the wavelength conversion element.

According to a further embodiment, the nanoparticles only comprise one single sort of organic luminescent molecules. As an alternative, it is possible for the wavelength conversion element to contain multiple different groups of nanoparticles, and each group of nanoparticles is formed by particles containing the same organic luminescent molecules, wherein the organic luminescent molecules of the individual nanoparticle groups differ from one another. In other words, more different particle groups can be present and each particle group is formed by particles containing the same organic luminescent molecules. The different particle groups can be arranged spatially separated in the wavelength conversion element. This enables arranging nanoparticles with different dye molecules in a spatially-structured manner in the light path of the light-emitting component for example. This enables producing laterally-neighboring segments or pixels, for example. The light-emitting semiconductor component may, for example, be designed as segmented monolithic semiconductor structure, for example, the structure having individually-controllable areas. By arranging different nanoparticles on the individual segments, the light-emitting device can be configured as multicolor micro display, as RGB microdisplay, for example.

According to at least one embodiment, a light-emitting semiconductor component is provided in a method for producing a light-emitting semiconductor component. Furthermore, a wavelength conversion element is applied.

The features and embodiments described above and in the following apply just as well to the light-emitting device and the method for producing the light-emitting device.

For applying the wavelength conversion element, the nanoparticles can be applied by means of at least one or a combination of the following application methods: Dispensing process, spraying, printing, electrophoresis, electrospraying.

Furthermore, it is also possible to apply a pre-manufactured wavelength conversion element already containing the nanoparticles. The wavelength conversion element having the nanoparticles may therefore be produced by means of a printing process or a molding process, such as by an injection molding process, a compression molding process, a transfer molding process or a foil-assisted transfer molding process.

Furthermore, the nanoparticles can be applied with one of the materials mentioned above in a solvent, wherein the solvent is subsequently removed. The nanoparticles can furthermore be applied together with a matrix material or a matrix material can be applied on the previously-applied nanoparticles. It is furthermore just as well possible for the wavelength conversion element to be free of a matrix material.

BRIEF DESCRIPTION OF THE DRAWINGS

Other advantages, advantageous embodiments and further developments are indicated in the exemplary embodiments described in conjunction with the figures.

The figures show.

Throughout the exemplary embodiments, same, similar or equivalent elements may in each case be indicated with the same reference numerals. The elements shown and their size ratios are not to be considered as true to scale, rather, individual elements such as layers, components, elements and areas may be illustrated in an exaggerated size for the purpose of a better understanding.

DETAILED DESCRIPTION OF ILLUSTRATIVE EMBODIMENTS

Figure 1:
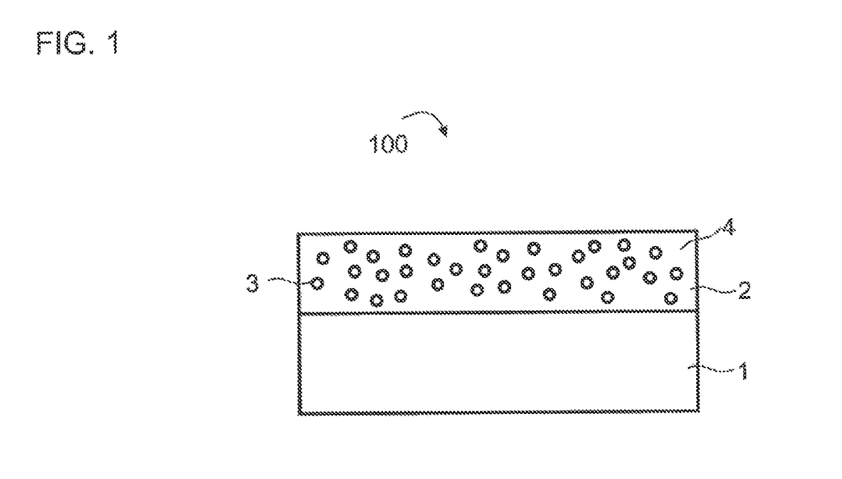
FIG. 1 a light-emitting device according to an exemplary embodiment.

FIG. 1 shows a light-emitting device 100 which comprises a light-emitting semiconductor component 1 radiating first light in a first wavelength range during operation. A wavelength conversion element 2 is arranged in the beam path of the first light, which converts the first light at least partially into a second light in a second wavelength range different from the first wavelength range.

The light-emitting semiconductor component 1 may be a semiconductor component emitting inorganic light, for example. For example, the semiconductor component emitting inorganic light may comprise or consist of an inorganic light-emitting diode. The inorganic light-emitting diode may comprise a light-emitting semiconductor chip comprising at least one active layer for generating the first light. Depending on the desired wavelength to be radiated, the light-emitting semiconductor chip may be produced on the basis of different semiconductor material systems. For visible short-wave light, i.e. in particular blue or green light and/or ultraviolet light, a semiconductor layer sequence on the basis of $In_xGa_yAl_{1-x-y}N$ is particularly suitable, with $0 \leq x \leq 1$ and $0 \leq y \leq 1$. For green to red light, the semiconductor layer sequence may for example comprise $In_xAl_yGa_{1-x-y}P$ with $0 \leq x \leq 1$, $0 \leq y \leq 1$ and $x+y \leq 1$, while AlGsAs-based semiconductor material is suitable to produce light in a red to infrared wavelength range, for example.

The light-emitting semiconductor component may particularly comprise or consist of a semiconductor layer sequence, particularly preferably an epitaxially-grown semiconductor layer sequence. To that end, the semiconductor layer sequence may be grown on the growth substrate by means of an epitaxy method, metalorganic vapor phase deposition (MOVPE) or molecular beam epitaxy (MBE) and be provided with electric contacts. By singulating the growth substrate having the semiconductor layer sequence grown thereon, a plurality of light-emitting semiconductor chips can be provided. Furthermore, the semiconductor layer sequence can be transferred to the substrate prior to singularization and the growth substrate may be thinned or completely removed. Such semiconductor chips, comprising a carrier substrate instead of the growth substrate, may also be referred to as so-called thin-film semiconductor chips.

A thin-film semiconductor chip is in particular characterized by the following characteristic features:

a reflective layer is applied or formed on a first main surface of a radiation-generating epitaxial layer sequence facing the carrier substrate, the layer reflecting at least part of the electromagnetic radiation generated in the epitaxial layer sequence back into the epitaxial layer sequence, the epitaxial layer sequence has a thickness of approximately 20 µm or less, in particular between 4 µm and 10 µm; and the epitaxial layer sequence includes at least one semiconductor layer with at least one surface having an intermixing structure, which in the ideal case leads to an approximately even ergodic distribution of the light in the epitaxial epitaxial layer sequence, i.e. it presents a possible ergodic, stochastic scattering behavior.

A thin film semiconductor chip in good approximation is a Lambert surface radiator. The basic principle of a thin film light diode chip is, for example, described in document I. Schnitzer et al., Appl. Phys. Lett. 63 (16) 18 Oct. 1993, 2174-2176.

The semiconductor layer sequence may comprise a conventional p-n-junction, a double hetero-structure, a single quantum well (SQW) structure or a multi-quantum well (MQW) structure. Besides the active region, the semiconductor layer sequence may comprise further functional layers and functional regions, such as p- and/or n-junction-doped functional charge carrier transport layers, i.e. electron or hole transport layers, un-doped or n-doped or p-doped confinement, cladding and waveguide layers, barrier layers, planarization layers, buffer layers, protection layers and/or electrodes as well as combinations thereof.

Additionally, or as an alternative, the light-emitting semiconductor component 1 may as well comprise or consist of an organic light-emitting semiconductor component, such an organic light-emitting diode (OLED). Referring to the principle structure of an organic light-emitting semiconductor component, reference is made to WO 2010/066245 A1, which is expressively incorporated herein by reference as concerning the structure of an organic light-emitting semiconductor component.

The wavelength conversion element 2 comprises a plurality of nanoparticles 3. In the exemplary embodiment shown, the nanoparticles 3 are arranged in a matrix material 4. As an alternative thereto, the nanoparticles 3 may as well form the wavelength conversion element 2 without the matrix material 4 and be arranged in the beam path of the first light of the light-emitting semiconductor component 1. As an alternative to the shown uniform distribution of nanoparticles 3 in the matrix material 4, these nanoparticles may as well be arranged in the matrix material 4 in a spatial manner.

As shown in FIG. 1, the wavelength conversion element 2 may be arranged directly on the light-emitting semiconductor component 1. The wavelength conversion element 2 may be arranged directly on one or more of the surfaces of the light-emitting semiconductor component 1 to that end. As an alternative, a so-called remote arrangement is possible as well, in which the wavelength conversion element 2 may be arranged at a distance of the light-emitting semiconductor component 1. To this end, other materials, in the form of layers or a potting of the light-emitting semiconductor component 1, for example, may be arranged between the light-emitting semiconductor component 1 and the wavelength conversion element 2. Furthermore, it is possible for a gas such as light to be present between the light-emitting semiconductor component 1 and the wavelength conversion element 2. The light-emitting device 100 may further comprise a housing, for example, in which the light-emitting semiconductor component 1 and the wavelength conversion element 2 are arranged (not shown).

The matrix material 4 may be a silicone or epoxy resin intermixed with nanoparticles 3, for example. As an alternative, the matrix material 4 may also comprise one or more of the materials mentioned above in the general section.

The nanoparticles 3 are explained in detail, here and in the following, in conjunction with FIGS. 2 to 4, in which exemplary embodiments for nanoparticles are shown.

Figure 2:
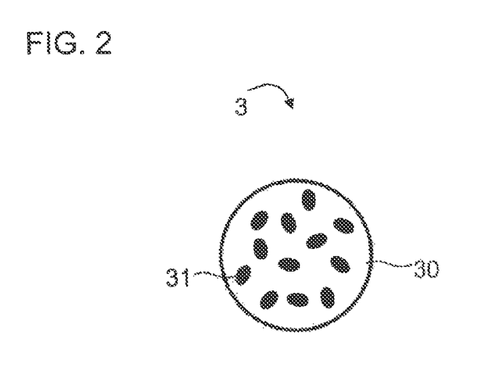
FIGS. 2 to 4 nanoparticles according to further exemplary embodiments.

FIG. 2 shows a nanoparticle 3 which comprises a basic substrate 30 containing organic luminescent molecules 31. In particular, the organic luminescent molecules 31 are enclosed by the basic material 30 so that nanoparticle 3 comprises the molecules 31 inside thereof. The basic material 30 is preferably formed of photo-physically inert material, particularly preferably a glass-like material. In the exemplary embodiment shown, the basic material 30 is formed by a SiO2-based material containing the organic luminescent molecules 31. The SiO2-based material thus forms a matrix, in which the organic luminescent molecules 31 are enclosed and contained. By this, the organic luminescent molecules 31 are encapsulated from the environment and protected against degradation processes, the reaction with surrounding gas or the matrix material.

The organic luminescent molecules 31 may comprise pure organic molecules as well as organic molecules having metal atoms, in particular transition metal complexes with organic ligands. Without limiting the subject-matter described herein, reference is made to the following particularly preferred materials.

perylene imides
parylene carboxylates
transition metal complexes having transition metals, selected from Os(III), Ru(III), Ir(III), Pt(III), and organic ligands, selected from one or more of the following materials, which are derived from the following basic matrices: porphyrins, porphines, 2,2-bipyridines, 2-phenylpyridines, 3-(thiazole-2-yl), 3-(Benzothiazole-2-yl), 3-(Imidazole-2-yl), 3-(benzimidazole-2-yl), pyridyl azolates.

The organic luminescent molecules 31 may additionally or alternatively comprise one or more of the further materials mentioned above in the general section.

In addition to the organic luminescent molecules 31, further materials may be contained in the basic material 30, for example one or more selected from the following materials: alkaline metals, alkaline earth-metals, halogens, Al, Zr, Hf, Ge, Sn, Pb, B, In, Ga, N, C, P, Ti, Sc, Y, As, Sb, S, Se, H, deuterium. The additional materials and elements, respectively, preferably have a content of less than 5% and particularly preferred of less than 1% in the basic material 30, i.e. in particular in the $SiO_2$-based material, concerning the weight of the nanoparticles 3. Furthermore, semiconductor nanoparticles can be introduced in the $SiO_2$ material 30, for example.

In the light-emitting device 100 shown in FIG. 1, for example, the nanoparticles 3 may be present in a specially-selected size distribution in the wavelength conversion element 2. For example, the nanoparticles 3 may have a size ranging from greater than or equal to 1 nm and less than or equal to 1000 nm. In particular, the sizes range from greater than or equal to 1 nm or less than or equal to 100 nm or greater than or equal to 10 nm or greater than or equal to 50 nm are preferred. As an alternative, the nanoparticles 3 may also have other sizes mentioned above in the general section.

Depending on the application, the nanoparticles 3 may include only one sort of organic luminescent materials 31. Furthermore, it is as well possible for the nanoparticles 3 to contain a mix of multiple of the organic luminescent materials 31. The organic luminescent molecules may in particular be formed as described above in the general section and accordingly comprise the above-described features.

Figure 3:
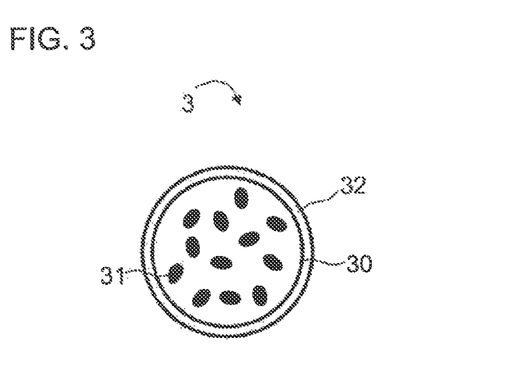

FIG. 3 shows another exemplary embodiment for a nanoparticle 3, which additionally comprises a coating 32 around the $SiO_2$-based material 30, enclosing the nanoparticle 3. The coating 32 may be formed of an inorganic material, such as $Al_2O_3$, for example. Furthermore, it is also possible, to use an organic coating 32. The organic coating 32 may in particular have the following features: It can prevent a particle aggregation, for example, in a matrix material. Furthermore, the coating may lead to a change of the refractive index of the wavelength conversion element or may as well serve as a wavelength filter. This enables filtering short-wave excitation light, i.e. first light of the light-emitting component, in order to prevent a chemical decomposition of the organic luminescent molecules and/or absorb certain emission areas of the wavelength conversion substance in order to make the spectrum of the second light more narrow-banded.

Figure 4:
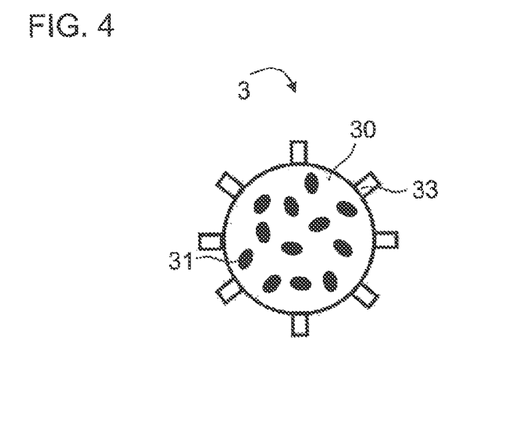

FIG. 4 shows another exemplary embodiment for a nanoparticle 3, comprising anchor molecule chains 33 on its surface. The molecule chains may be provided to bind the nanoparticles 3 to certain chemical surfaces in a chemical and selective manner. If suitable anchor molecule chains 33 and surfaces are used, for example in the light-emitting semiconductor component, monolayers of nanoparticles can be produced on the respective surfaces in a self-limiting process. Anchor molecule chains with methoxy or ethoxy groups may be used, for example, as described above in the general section. As an alternative or in addition, other anchor molecule chains, described above in the general section, can be used, which may allow binding to the surface materials described in the general section above.

For producing the light-emitting device 100 according to FIG. 1, the nanoparticles 3 may, for example, be applied in a formulation with the matrix material 4 into the light path of the light-emitting semiconductor component 1 by a dispensing method, by spraying, or a printing method. Furthermore, it is as well possible to introduce the nanoparticles 3 in an electrical voltage field by electrophoresis or electro spray-coating into the light path of the light-emitting semiconductor component 1. After application of the nanoparticles 3, the particles can optionally be provided with another matrix material, provided that they have already been applied together with a matrix material 4. Furthermore, it is as well possible to apply the nanoparticles 3 in a volatile solvent which is subsequently removed by means of evaporation, for example. By means of application in an electric voltage field or by use of a solvent, it may in particular just as well be possible to apply the nanoparticles without a matrix material.

Furthermore, it is also possible to pre-manufacture the wavelength conversion element 2, for example, and then apply it in the light path of the light-emitting semiconductor component 1 as a pre-manufactured conversion element. A pre-manufactured wavelength conversion element may for example be produced by a printing process or a forming process, for example by injection molding, compression molding, transfer molding or foil-assisted transfer molding.

Figure 5:
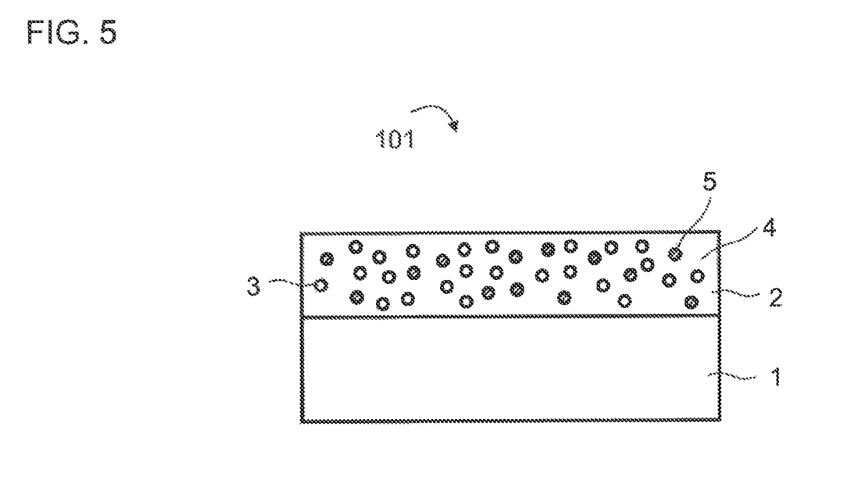
FIGS. 5 and 6 light-emitting devices according to further exemplary embodiments.

FIG. 5 shows a light-emitting device 101 according to another exemplary embodiment, which, when compared to the light-emitting device 100, comprises scattering particles 5 in addition to the nanoparticles 5. The particles may for example be formed by a colorless, i.e. only light-scattering material as for example TiO2, Al2O3, or glass particles. By adding additional scattering particles 5, the radiation profile and the conversion degree of the wavelength conversion element 2 can be adjusted and optimized independent from another.

Alternatively or additionally, the wavelength conversion element 2 may contain other fillers which, for example, prevent aggregation of the nanoparticles 3, change the refractive index or serve as a wavelength filter.

Alternatively or additionally, it is as well possible for the wavelength conversion element 2 to contain other materials as conversion materials besides the nanoparticles 3 as a material for light conversion. For example, inorganic wavelength conversion substances such as the phosphors described above in the general section can be included in the wavelength conversion element 2 in addition to the nanoparticles 3.

Figure 6:
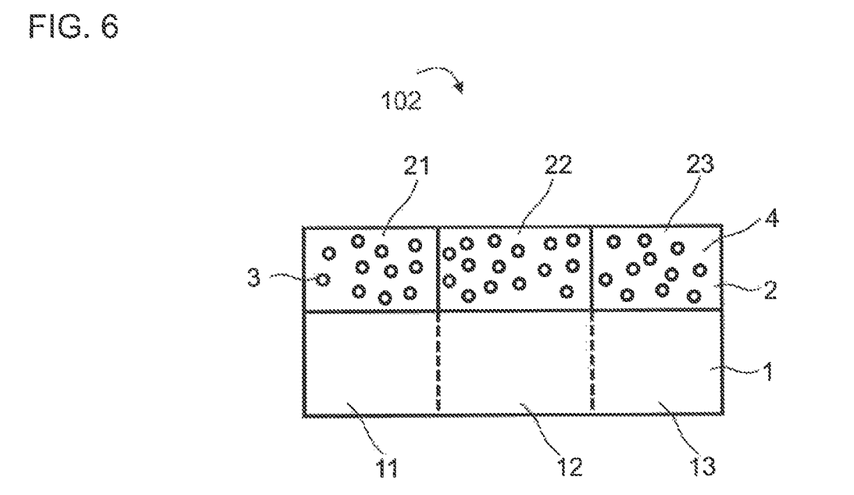

FIG. 6 shows a light-emitting device 102 according to a further exemplary embodiment which, compared to the light-emitting devices 100 and 101 of FIGS. 1 and 5, comprises a light-emitting semiconductor component 1 comprising separately controllable segments 11, 12, 13. The segment may be configured as segments of a semiconductor structure produced in a monolithic way and can be electrically contacted separately from one another, for example. Accordingly, the wavelength conversion element 2 is divided into segments 21, 22, 23 arranged on the segments 11, 12, 13 of the light-emitting semiconductor component 1. The segments 21, 22, 23 contain in each case a particle group with nanoparticles 3, being identical within the groups, while the particle groups are configured differently to one another and comprise nanoparticles 3 with different organic luminescent materials. By this is allowed for the segments 21, 22, 23 to radiate second light differently from one another, such that together with the segmented light-emitting component 102, a multicolored display, for example a RGB-micro display, can be realized.

According to other exemplary embodiments, the features described in the exemplary embodiments can be combined with one another even if such combinations are not explicitly shown in the figures. Furthermore, the exemplary embodiments described in the figures may comprise additional or alternative features according to the general description.

The invention is not limited by the description with reference to the exemplary embodiments. The invention rather comprises any new feature as well as any combination of features, particularly including any combination of features in the patent claims, even if the feature or the combination per se is not explicitly indicated in the patent claims or the exemplary embodiments.

The invention claimed is:

1. A light-emitting device, comprising:
   a light-emitting semiconductor component that radiates first light in a first wavelength range during operation; and
   a wavelength conversion element arranged in a beam path of the first light, wherein the wavelength conversion element is configured to convert the first light at least partially into second light in a second wavelength range different from the first wavelength range, the wavelength conversion element comprising nanoparticles containing organic luminescent molecules in an $SiO_2$-based basic material, wherein at least some nanoparticles contain a plurality of different organic luminescent molecules.

2. The device according to claim 1, wherein the nanoparticles comprise a coating on the basic material.

3. The device according to claim 2, wherein the coating has physical properties that prevent a particle aggregation, increase pourability of the particles, change a refractive index of the nanoparticles, or serve as a wavelength filter.

4. The device according to claim 1, wherein the wavelength conversion element comprises a matrix material, the nanoparticles being arranged in the matrix material.

5. The device according to claim 4, wherein the wavelength conversion element comprises, in the matrix material, fillers having physical properties that prevent a particle aggregation, increase pourability of the particles, change a refractive index of the nanoparticles, or serve as a wavelength filter.

6. The device according to claim 1, wherein the wavelength conversion element further comprises scattering particles.

7. The device according to claim 1, wherein multiple different particle groups are present in the wavelength conversion element, each particle group being formed by nanoparticles that contain the same organic luminescent molecules.

8. The device according to claim 7, wherein different particle groups are arranged spatially separated in the wavelength conversion element.

9. The device according to claim 1, wherein the organic luminescent molecules comprise one or more materials selected from the group consisting of: acridine dyes, acridinone dyes, anthraquino dyes, anthracene dyes, cyanine dyes, dansyl dyes, squaryllium dyes, spiropyrans, boron-dipyrromethenes, perylenes, pyrenes, naphthalenes, flavins, pyrroles, porphyrins and metal complexes thereof, diarylmethane dyes, triarylmethane dyes, nitro and nitroso dyes, phthalocyanine dyes and metal complexes of phthalocyanines, quinones, azo dyes, indophenol dyes, oxazines, oxazones, thiazines and thiazoles, fluorenes, flurones, pyronines, rhodamines, coumarins.

10. The device according to claim 1, wherein
    the organic luminescent molecules comprise transition metal complexes with organic ligands;
    the transition metals comprise metals selected from the group consisting of Rh, Os, Ru, Ir, Pd, and Pt; and
    the organic ligands comprise one or more materials derived from basic matrices selected from the group consisting of: porphyrins, porphines, 2,2-bipyridines, 2-phenylpyridines, 3-(thiazole-2-yl), 3-(benzothiazole-2-yl), 3-(imidazole-2-yl), 3-(benzimidazole-2-yl), pyridyl azolate.

11. The device according to claim 1, wherein the nanoparticles comprise anchor molecule chains so that the nanoparticles bind to preselected chemical surfaces in a chemical and selective manner.

12. The device according to claim 1, wherein the wavelength conversion element comprises further inorganic wavelength conversion substances in addition to the nanoparticles.

13. The device according to claim 1, wherein the light-emitting semiconductor component comprises an inorganic light-emitting diode.

14. The device according to claim 1, wherein the light-emitting semiconductor component comprises an organic light-emitting diode.

15. A method for producing a light-emitting device, the method comprising:
    providing a light-emitting semiconductor component that radiates first light in a first wavelength range during operation; and
    applying a wavelength conversion element in adjacent a beam path of the first light;
    wherein the wavelength conversion element is configured to convert the first light at least partially into second light in a second wavelength range different from the first wavelength range;
    wherein the wavelength conversion element comprises nanoparticles containing organic luminescent molecules in an $SiO_2$-based basic material;
    wherein at least some nanoparticles contain a plurality of different organic luminescent molecules; and
    wherein the nanoparticles are applied by at least one or a combination of the following application methods: dispensing, spraying, printing, electrophoresis, electrospraying, and applying a pre-manufactured wavelength conversion element with the nanoparticles.

16. The method according to claim 15, wherein applying the wavelength conversion element comprises applying the nanoparticles in a solvent, the method further comprising removing the solvent after applying the nanoparticles.

17. The method according to claim 15, wherein applying the wavelength conversion element comprises applying the nanoparticles together with a matrix material.

18. The method according to claim 15, further comprising applying a matrix material to the nanoparticles after applying the wavelength conversion element.

19. The method according to claim 15, wherein the wavelength conversion element having the nanoparticles is pre-manufactured by a printing process or a molding process.

20. A light-emitting device, comprising:
- a light-emitting semiconductor component that radiates first light in a first wavelength range during operation; and
- a wavelength conversion element arranged in a beam path of the first light, wherein the wavelength conversion element is configured to convert the first light at least partially into second light in a second wavelength range different from the first wavelength range, the wavelength conversion element comprising nanoparticles containing organic luminescent molecules in an $SiO_2$-based basic material;
- wherein the organic luminescent molecules comprise transition metal complexes with organic ligands;
- wherein the transition metals comprise metals selected from the group consisting of Rh, Os, Ru, Ir, Pd, and Pt; and
- wherein the organic ligands comprise one or more materials derived from basic matrices selected from the group consisting of porphyrins, porphines, 2,2-bipyridines, 2-phenylpyridines, 3-(thiazole-2-yl), 3-(benzothiazole-2-yl), 3-(imidazole-2-yl), 3-(benzimidazole-2-yl), pyridyl azolate.

* * * * *